(12) United States Patent
Johnson et al.

(10) Patent No.: US 10,161,738 B2
(45) Date of Patent: Dec. 25, 2018

(54) OCT SWEPT LASER WITH CAVITY LENGTH COMPENSATION

(71) Applicant: Axsun Technologies, Inc., Billerica, MA (US)

(72) Inventors: Bartley C. Johnson, North Andover, MA (US); Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 680 days.

(21) Appl. No.: 14/144,636

(22) Filed: Dec. 31, 2013

(65) Prior Publication Data

US 2014/0218741 A1    Aug. 7, 2014

Related U.S. Application Data

(60) Provisional application No. 61/747,600, filed on Dec. 31, 2012.

(51) Int. Cl.
| | |
|---|---|
| *H01S 3/08* | (2006.01) |
| *G01B 9/02* | (2006.01) |
| *H01S 5/14* | (2006.01) |
| *H01S 3/083* | (2006.01) |
| *H01S 3/105* | (2006.01) |

(Continued)

(52) U.S. Cl.
CPC .......... *G01B 9/02091* (2013.01); *H01S 5/141* (2013.01); *H01S 5/146* (2013.01); *H01S 3/083* (2013.01); *H01S 3/08009* (2013.01); *H01S 3/08013* (2013.01); *H01S 3/105* (2013.01); *H01S 3/1062* (2013.01); *H01S 5/02284* (2013.01)

(58) Field of Classification Search
CPC ............ G01B 9/02091; G01B 2290/20; G01B 2290/30; H01S 5/141; H01S 5/146; H01S 5/02284; H01S 3/08009; H01S 3/083; H01S 3/105; H01S 3/1062
USPC .................................................. 356/479, 497
See application file for complete search history.

(56) References Cited

U.S. PATENT DOCUMENTS

| | | | | |
|---|---|---|---|---|
| 3,549,239 A | * | 12/1970 | Brienza .............. | G02B 27/4277 356/450 |
| 5,499,134 A | * | 3/1996 | Galvanauskas ...... | G02B 6/2713 359/333 |

(Continued)

OTHER PUBLICATIONS

Huber, R., et al., "Fourier Domain Mode Locking (FDML): A new laser operating regime and applications for optical coherence tomography," Optics Express, vol. 14, No. 8, Apr. 17, 2006, 13 pages.

*Primary Examiner* — Tarifur Chowdhury
*Assistant Examiner* — Jonathon Cook
(74) *Attorney, Agent, or Firm* — HoustonHogle LLP (57) ABSTRACT

An optical coherence tomography system utilizes an optical swept laser that has cavity length compensator that changes an optical length of the laser cavity for different optical frequencies to increase the length of the laser cavity for lower optical frequencies. Specifically, a spectral separation between longitudinal cavity modes of the laser cavity is shortened or alternatively lengthened as a passband of a cavity tuning element sweeps through a scanband of the swept optical signal. In some examples, the compensator is implemented as two gratings. In others, it is implemented as a chirped grating device.

15 Claims, 13 Drawing Sheets

(51) Int. Cl.
  *H01S 3/106* (2006.01)
  *H01S 5/022* (2006.01)

(56) References Cited

U.S. PATENT DOCUMENTS

| | | | | |
|---|---|---|---|---|
| 6,215,928 | B1* | 4/2001 | Friesem | G02F 1/025 |
| | | | | 372/102 |
| 6,282,215 | B1 | 8/2001 | Zorabedian et al. | |
| 6,324,193 | B1* | 11/2001 | Bourzeix | H01S 3/1398 |
| | | | | 372/102 |
| 6,501,551 | B1* | 12/2002 | Tearney | A61B 1/00096 |
| | | | | 356/477 |
| 6,665,471 | B1* | 12/2003 | Farmer | H01S 5/143 |
| | | | | 372/102 |
| 6,868,100 | B2* | 3/2005 | Larson | H01S 5/06256 |
| | | | | 372/20 |
| 7,415,049 | B2 | 8/2008 | Flanders et al. | |
| 7,519,096 | B2* | 4/2009 | Bouma | A61B 5/0059 |
| | | | | 372/102 |
| 7,916,387 | B2* | 3/2011 | Schmitt | A61B 5/0066 |
| | | | | 359/344 |
| 2001/0026568 | A1* | 10/2001 | Asami | H01S 5/141 |
| | | | | 372/50.11 |
| 2002/0009108 | A1* | 1/2002 | Kopylow | H01S 3/1062 |
| | | | | 372/38.01 |
| 2002/0191651 | A1* | 12/2002 | Funakawa | H01S 5/141 |
| | | | | 372/20 |
| 2003/0231692 | A1* | 12/2003 | Belikov | G02B 5/1828 |
| | | | | 372/102 |
| 2004/0090783 | A1* | 5/2004 | Chang | H01S 5/141 |
| | | | | 362/293 |
| 2005/0238070 | A1* | 10/2005 | Imeshev | G02F 1/3558 |
| | | | | 372/21 |
| 2007/0268939 | A1* | 11/2007 | Cattellan | H01S 5/141 |
| | | | | 372/20 |
| 2008/0165366 | A1* | 7/2008 | Schmitt | A61B 5/0066 |
| | | | | 356/519 |
| 2008/0298406 | A1* | 12/2008 | Day | B82Y 20/00 |
| | | | | 372/39 |
| 2009/0290613 | A1* | 11/2009 | Zheng | H01S 5/141 |
| | | | | 372/99 |
| 2014/0071455 | A1* | 3/2014 | Dimashkie | G01C 19/721 |
| | | | | 356/460 |

* cited by examiner

OCT SWEPT LASER WITH CAVITY LENGTH COMPENSATION

RELATED APPLICATIONS

This application claims the benefit under 35 USC 119(e) of U.S. Provisional Application No. 61/747,600, filed on Dec. 31, 2012, which is incorporated herein by reference in its entirety.

BACKGROUND OF THE INVENTION

Optical coherence analysis relies on the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections or three-dimensional volume renderings of the sample by using information on how the waves are changed upon reflection.

There are several different classes of OCT, but Fourier domain OCT currently offers the best performance for many applications. Moreover, of the Fourier domain approaches, swept-source OCT has distinct advantages over techniques such as spectrum-encoded OCT because it has the capability of balanced and polarization diversity detection. It has advantages as well for imaging in wavelength regions where inexpensive and fast detector arrays, which are typically required for spectrum-encoded OCT, are not available.

In swept source OCT, the spectral components are not encoded by spatial separation, but they are encoded in time. The spectrum is either filtered or generated in successive optical frequency sampling intervals and reconstructed before Fourier-transformation. Using the frequency scanning swept source, the optical configuration becomes less complex but the critical performance characteristics now reside in the source and especially its frequency sweep rate and tuning accuracy.

High speed frequency tuning, or sweep rates, for OCT swept sources is especially relevant to in vivo imaging where fast imaging reduces motion-induced artifacts and reduces the length of the patient procedure. It can also be used to improve resolution.

The swept sources for OCT systems have typically been tunable lasers. The advantages of tunable lasers include high spectral brightness and relatively simple optical designs. A tunable laser is constructed from a gain element, such as a semiconductor optical amplifier (SOA) that is located within a resonant laser cavity, and a tuning element such as a rotating grating, grating with a rotating mirror, or a Fabry-Perot tunable filter. Currently, some of the highest tuning speed/sweep rate lasers are based on the laser designs described in U.S. Pat. No. 7,415,049 B1, entitled Laser with Tilted Multi Spatial Mode Resonator Tuning Element, by D. Flanders, M. Kuznetsov and W. Atia. The use of micro-electro-mechanical system (MEMS) Fabry-Perot tunable filters combines the capability for wide spectral scan bands with the low mass, high mechanical resonant frequency deflectable MEMS membranes that have the capacity for high speed tuning/sweep rates. Another laser architecture is termed a Fourier-domain mode-locked laser (FDML). This type of laser stores light in a long length of fiber for amplification and recirculation in synchronism with the laser's tuning element. See "Fourier Domain Mode Locking (FDML): A new laser operating regime and applications for optical coherence tomography", R. Huber, M. Wojtkowski, and J. G. Fujimoto, 17 Apr. 2006/Vol. 14, No. 8/OPTICS EXPRESS 3225. The drawback of these devices is their complexity, however. Moreover, the ring cavity including the long storage fiber creates its own performance problems such as dispersion and instability.

The use of laser-based swept sources, however, does have problems. The instantaneous laser emission is characterized by one or more longitudinal laser cavity modes that simultaneously lase within the passband of the laser's tuning element. Then as the laser tunes, the power within these modes shifts between the modes and to new cavity modes that see gain as the tuning element's passband scans in frequency. This shifting of the power between modes and to new modes results in mode hopping noise that degrades performance of OCT systems.

SUMMARY OF THE INVENTION

The present invention is directed to an OCT method and system and swept laser that seeks to improve performance during the generation of the swept optical signal. This is accomplished using an intra-cavity element that compensates the positions of the longitudinal modes within the cavities for the different optical frequencies that may lase in the cavity. Specifically, it changes an optical length of the laser cavity for the different optical frequencies. These changes in length as a function of frequency can be used to smooth tuning and increase coherence length.

This class of lasers can be referred to as phase altered tunable lasers. In general, they provide for a phase change versus wavelength for the cavity that is different than the standard mirror spacing model.

In the present case, by using a dispersive element in the cavity, the mode structure is altered from a cavity of a set physical length. This enables a reduction or even an increase in the density of the modes.

In one case, by precisely compensating for the dispersion of a linear cavity with a section of negative dispersion cavity, a cavity is provided that supports only one mode over wide bandwidths, such that by changing the phase in the cavity by only half a wavelength, tuning over wide scan ranges is achieved. When the compensation is not perfect, there will be more than one mode in the band of interest. As long as a phase modulator is further provided in the cavity that can have a range of length compensation, then the laser will have modes in the range of interest and can remain single mode over the scan range. Further, the requirements for the filter tuning element needed to select a single mode are reduced which can lead to a reduction of the number of modes over a single linear cavity. This provides for some interesting trade-offs including the use of higher resonant frequency tuning elements that provide lower spectral selectivity.

In the alternative case, the mode density in the cavity is increased. This can be used in a short cavity were mode hops of the linear cavity would otherwise become widely spaced. The advantages of linewidth narrowing by increasing the passes through the gain medium for short cavity would be combined with reduction in mode hopping over a longer cavity.

In general, according to one aspect, the invention features an optical coherence tomography system. This system comprises an interferometer that combines a swept optical signal from a sample and from a reference path to generate an interference signal. A swept laser is then used to generate the swept optical signal. This swept laser comprises a laser cavity and a cavity length compensator that changes an optical length of the laser cavity for different optical frequencies. Finally, a detection system is used to detect the interference signal.

In preferred embodiments, the cavity length compensator changes in optical length of the laser cavity for different optical frequencies to improve frequency sweeping of the swept optical signal or sweeping performance of the swept laser, especially in terms of performance for OCT applications. In the preferred embodiment, the compensator changes an optical length of the laser cavity to increase the length of the laser cavity for lower optical frequencies. As a consequence, the spectral separation between longitudinal cavity modes of the laser cavity as the passband of the tuning element sweeps through a scan band of the swept optical signal is reduced.

In one embodiment, the cavity length compensator comprises a grating for directing lower optical frequencies over increasingly longer paths within the cavity. In another embodiment, the cavity length compensator comprises a fiber grating with a varying pitch along its length that reflects lower optical frequencies at increasingly longer paths within the cavity.

In a different embodiment, the cavity length compensator comprises a grating or fiber grating that directs higher optical frequencies over increasingly longer paths within the cavity.

In general, according to another aspect, the invention features a swept laser that generates a swept optical signal. This laser comprises a laser cavity in which the swept optical signal is generated. A tuning element controls an optical frequency of the swept optical signal. A gain element amplifies light within the laser cavity. Finally, and according to the present invention, a cavity length compensator is further provided that changes an optical length of the laser cavity for different optical frequencies.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
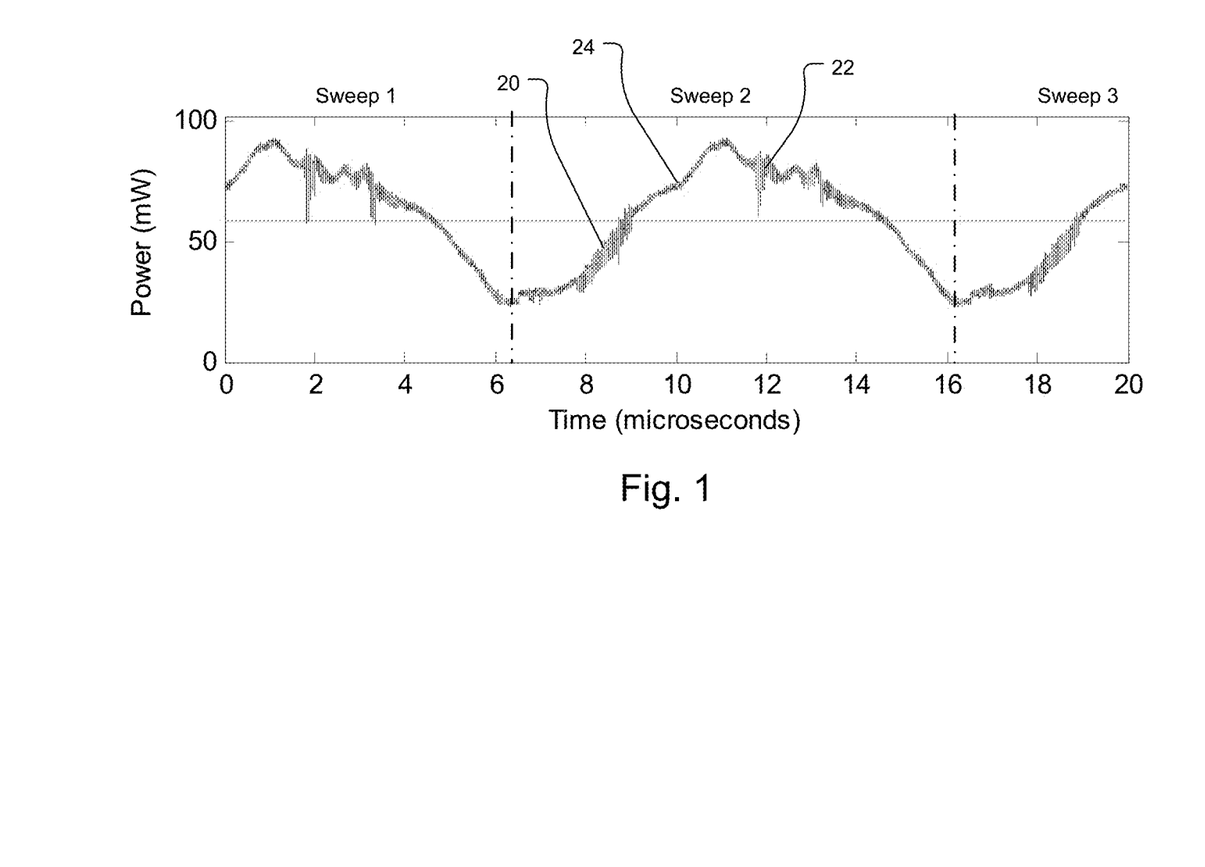
FIG. 1 is a plot of power of the swept optical signal as a function of time for a series of sweeps of the swept optical signal through the scan band.

Turning now to the drawings, FIG. 1 illustrates a basic problem when using swept lasers as the swept source in OCT systems. This is a plot of power in the Watts as a function of time in microseconds. The plot covers a series of sweeps through the scan band by the swept laser: sweep 1, sweep 2, sweep 3. As shown, during some of the portions of the sweeps the optical power in the swept optical signal is relatively stable, see reference numeral 24. However in other portions, power in the swept optical signal is glitchy, see reference numerals 20, 22. That is, the optical power generated by the swept optical signal varies as a function of time and is not stable through these portions of the sweep. This can impact coherence length of the swept optical signal.

These instabilities are generated by a number of phenomena. One is the fact that often the swept lasers exhibit mode locking behavior. Another related source is mode hopping noise. The cavity of the swept laser only supports discrete longitudinal modes that are related to the specific standing waves that can resonant in the cavity. As a tuning element sweeps through the scan band, its passband overlaps with these cavity modes, and the optical power within the cavity resides within these cavity modes. As a power distribution between the modes changes and new modes see gain due to the tuning of the tuning element, power moves between these modes in a sometimes unstable fashion. This results in noise.

Figure 2:
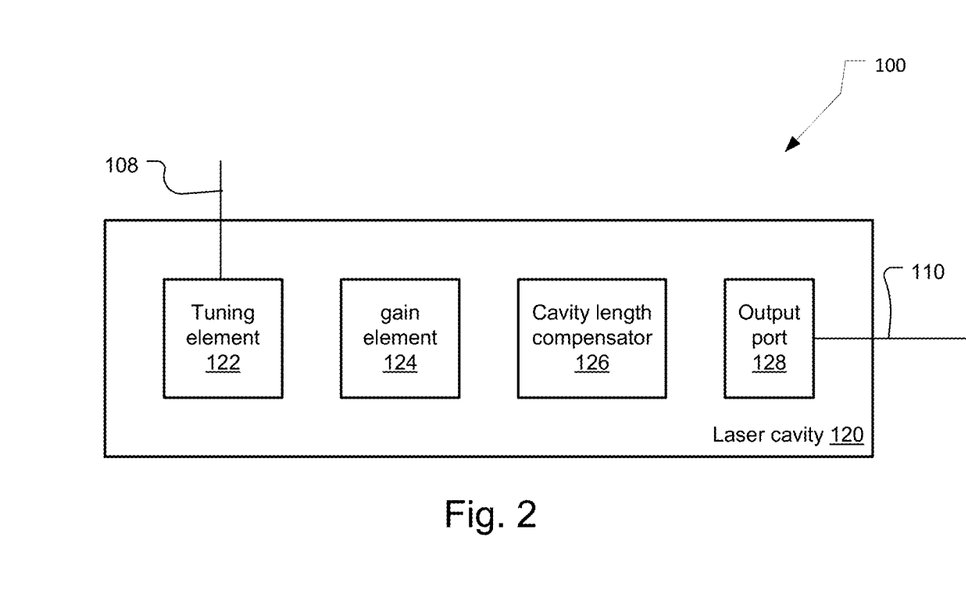
FIG. 2 is a block diagram illustrating a swept laser according to the present invention.

FIG. 2 illustrates a swept laser according to the present invention.

As is characteristic of lasers, the swept laser 100 includes a laser cavity 120. Light within the cavity is coupled from it via an output port 128. In the illustrated example, the light is coupled out of the cavity 120 onto an optical fiber 110.

A gain element 124 is provided in the cavity 120. In a typical example, the gain element 124 is a semiconductor optical amplifier. In other examples, a rare earth doped optical fiber gain element is used. Still other examples are solid-state optical gain media. The gain element 124 amplifies light within the cavity.

Also within the cavity is a tuning element. The tuning element typically has a tunable passband that scans over a scan band. This passband overlaps with the gain spectrum of the gain element 124. It allows optical energy within the passband to be amplified within the laser cavity and then be coupled onto optical fiber 110 via the output port 128. In some embodiments, the tuning element 124 is a Fabry Perot tunable filter. In other examples, grating based tuning elements are used. Still other examples are the acousto optic tunable filters or tunable filters utilizing other mechanisms.

According to the invention, the laser cavity 120 further comprises a cavity length compensator 126. The cavity length compensator functions to change the optical length of the laser cavity for different optical frequencies. In one application, the cavity length compensator changes an optical length of the laser cavity for different optical frequencies to reduce noise and increase coherence length during frequency sweeping of the swept optical signal. In particular, the cavity length compensator 126 changes in optical length of the laser cavity for different optical frequencies to increase the length of the laser cavity for lower optical frequencies. This can be used to shorten a spectral separation between longitudinal cavity modes of the laser cavity as the passband of the cavity tuning element 124 is swept through the scan band of the swept optical signal. In other examples, however, the cavity length compensator 126 changes in optical length of the laser cavity for different optical frequencies to decrease the length of the laser cavity for lower optical frequencies.

The swept laser 100 is generally intended for high speed tuning to generate swept optical signals that repeatedly scan over the scan band(s) at rates of greater than 1 kiloHertz (kHz). In current embodiments, the swept laser 100 repeatedly tunes over the scanband at speeds greater than 20 or 100 kHz. In very high speed embodiments, the swept laser 100 tunes at speeds greater than 200 or 500 kHz. On the other hand, the bandwidth of the narrowband emission has a full width half maximum (FWHM) bandwidth of less than 20 or 10 GigaHertz (GHz), and is preferably 5 GHz or less, to even operating in a regime where only a single longitudinal mode is lasing within the cavity at any given moment of operation.

For spectroscopy, this relatively narrow bandwidth yields high spectral resolution. For optical coherence tomography, this high spectral resolution implies a long coherence length of the source and therefore enables imaging deeper into samples, for example deeper than 5 millimeters (mm). In lower performance applications, for example OCT imaging less than 1 mm deep into samples, broader FWHM bandwidths of the passband of the tuning element are sometimes appropriate, such as bandwidths of about 200 GHz or less.

Typically, the width of the tuning or scan band provided by the tunable element 122 is greater than 10 nanometers (nm). In the current embodiments, it is preferably between 50 and 150 nm, although even wider tuning bands are contemplated in some examples.

Figure 3A:
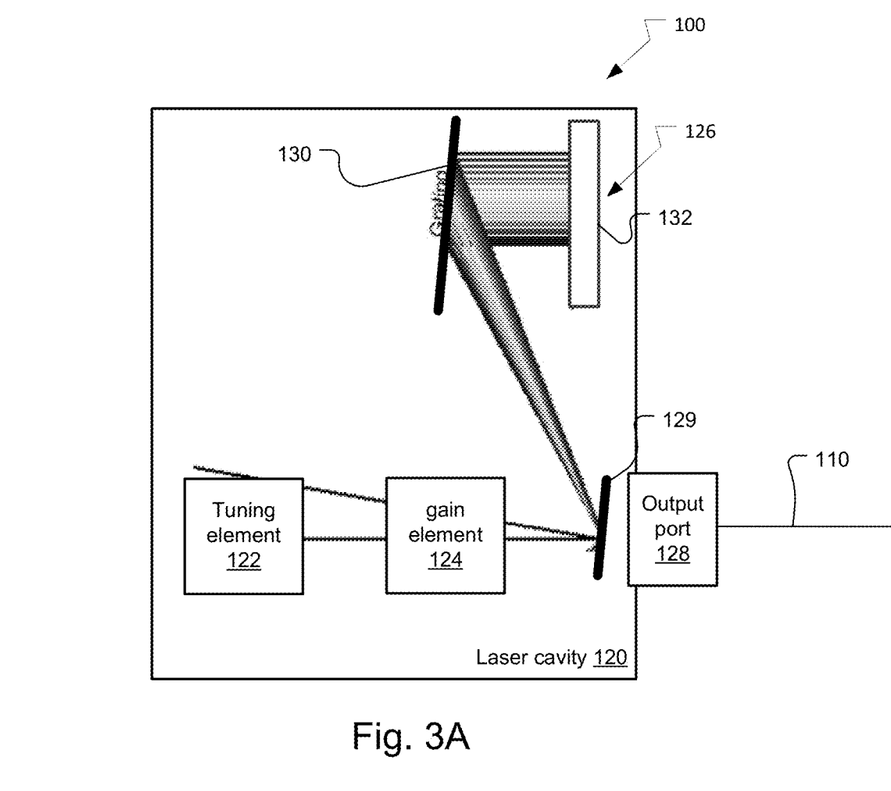
FIG. 3A is a schematic diagram illustrating a swept laser according to a first embodiment.

FIG. 3A illustrates a first embodiment of the swept laser 100. In this example, the cavity length compensator 126 comprises two gratings 129, 130 and a mirror 132.

In more detail, the first grating 129 receives the light exiting from the gain element 124. It spatially disperses this light such that the longer wavelengths/lower frequencies travel a longer distance to a second grating 130. The pitch of the second grating is such that the different optical or frequencies or wavelengths impinging on the grating 130 along its length are reflected to be parallel to each other. The wavelengths then reflect off a mirror 126 to return to the second grating 130 and then are the combined by the first grating 129 to reenter the gain element 124.

In this way, the two gratings 129, 130 function to provide different effective optical cavity lengths for the different frequencies that may oscillate in the cavity 120. In one current example, the scanband extends over the wavelength range: 1250 to 1350 nm. The gratings have: 600 lines/mm, a grating angle of 5 degrees, and a grating x-spacing of 12.000 mm, in one exemplary design.

Light exits the cavity through the optical port 128 that in one example is the light that is transmitted through the grating 129. In another example, the optical port 128 is located to collect light specularly reflected from the grating 129.

Figure 3B:
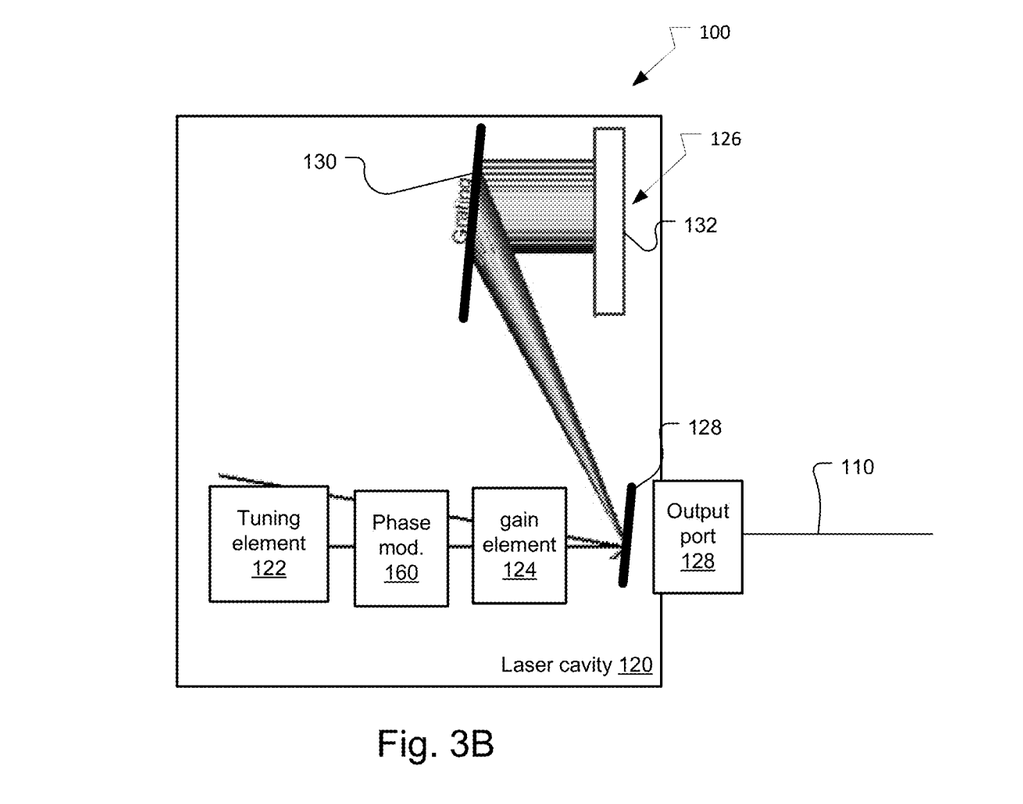
FIG. 3B is a schematic diagram illustrating a swept laser according to a variant of the first embodiment.

FIG. 3B shows a variant of the embodiment. It includes an intracavity phase modulator 160. This is used to trim the length of the cavity to keep it single mode as the tunable optical signals are scanned in frequency.

Figure 4:
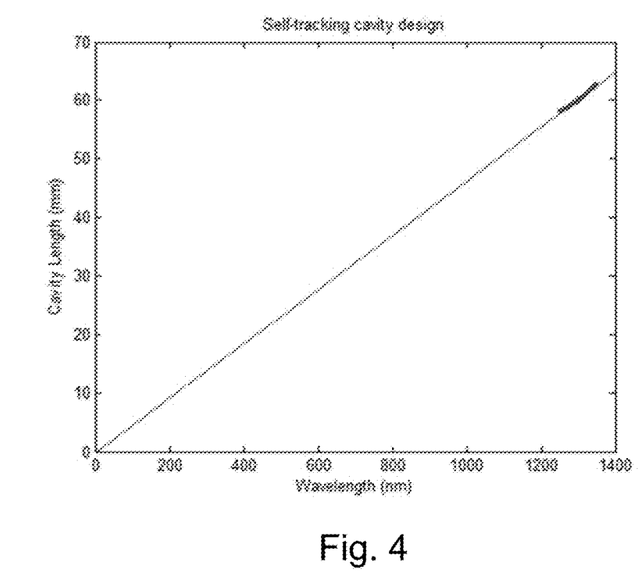
FIG. 4 is a plot of cavity length in millimeters as a function of wavelength in nanometers illustrating how the cavity length compensator increases the optical cavity for longer wavelengths or lower frequencies of the swept optical signal.

FIG. 4 shows the cavity length in millimeters as a function of wavelength for this self tracking cavity design. In one example, the cavity length as a function of wavelength exhibits a linear or near linear relationship. In another example, the cavity length as a function of frequency exhibits a linear or near-linear relationship. Also, as illustrated, the cavity length increases with increasing wavelength. Thus, for a laser operating with a scan band of 1250 to 1350 nm, in one example, the cavity length varies from approximately 50 mm for the shorter wavelengths to approximately 60 mm for the longer wavelength end of the scan band.

Figure 5:
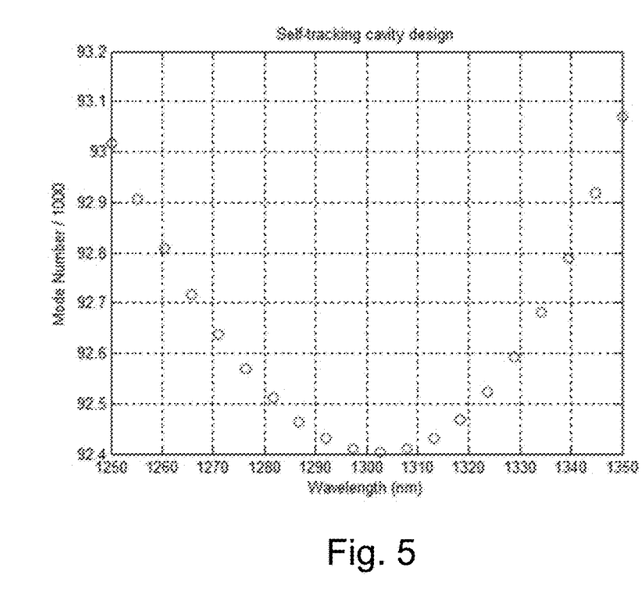
FIG. 5 is a plot of mode number as a function of wavelength in nanometers illustrating the operation of the cavity length compensator.

FIG. 5 illustrates a relationship between the mode number and the wavelength of operation for a scan band of the swept optical signal stretching from 1250 to 1350 nm.

In some cases, the cavity length compensation provided by the cavity length compensator 126 lowers noise and increases coherence length. In the typical operation, without cavity length compensation, the laser will mode hop over 7000 times during the tuning over the scanband. The compensator 126 reduces this number and/or makes the mode hops less noisy.

Figure 6:
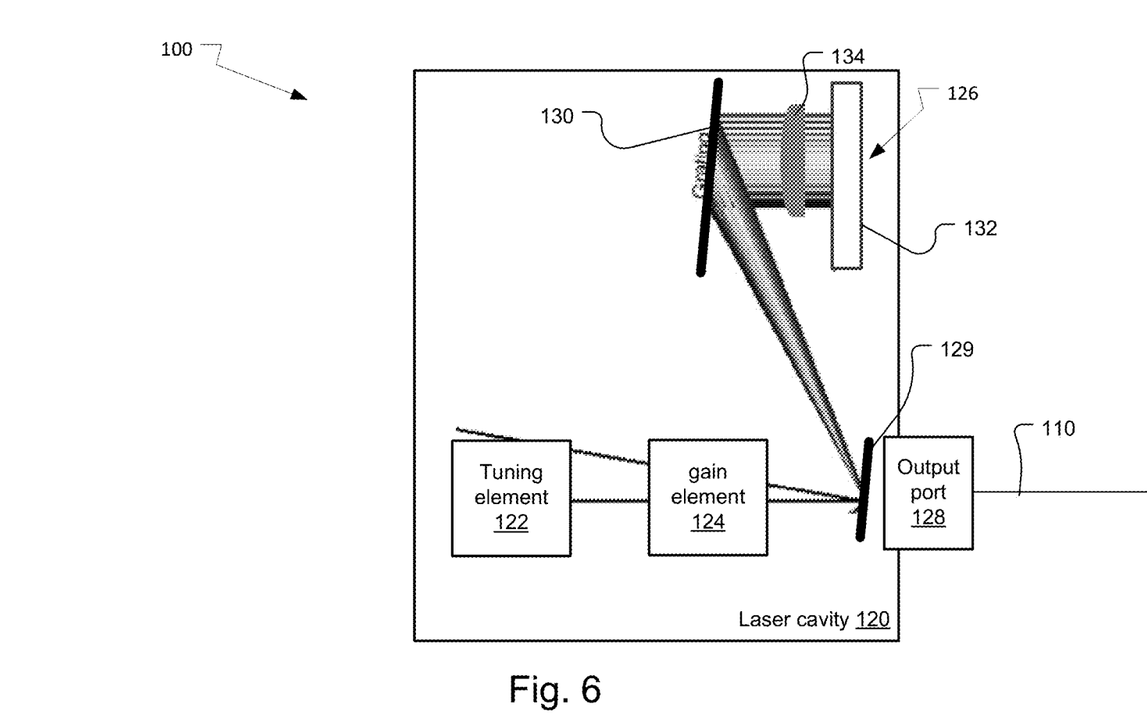
FIG. 6 is a schematic diagram illustrating a swept laser according to a second embodiment.

FIG. 6 shows a second embodiment that is similar to the embodiment of FIG. 3. It adds an additional cavity length compensating element 134, however. Specifically, a solid lens element is added that changes the optical length seen by the different frequencies of the swept optical signal oscillating in the cavity 120.

This correction plate compensating element 134 shortens the cavity length in the direction of the edges of the scanband relative to the center wavelength. In one example, it shortens the cavity by 600 wavelengths at 1250 nanometer and 1350 nanometers relative to the center wavelength of 1300 nanometers.

Figure 7:
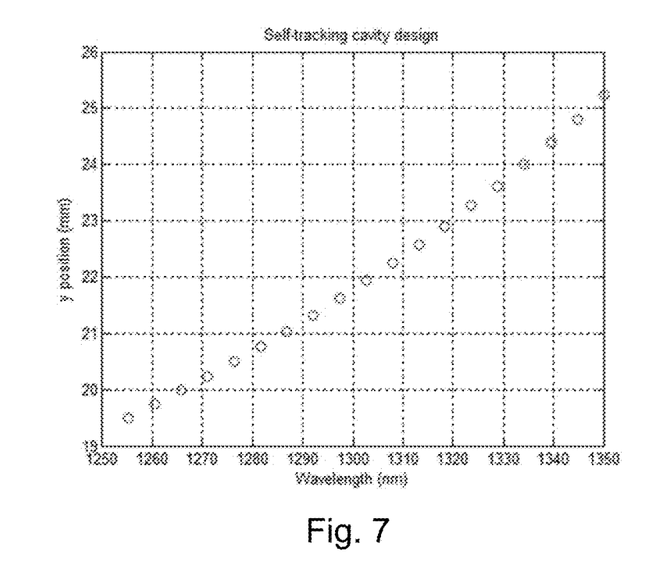
FIG. 7 is a plot of cavity length in millimeters as a function of wavelength in nanometers illustrating how the cavity length compensator increases the optical cavity for longer wavelengths or lower frequencies of the swept optical signal.

FIG. 7 shows the optical cavity length as a function of wavelength over a scan band stretching from 1250 to 1350 nm. Preferably, the relationship is linear in frequency. In the example, the compensator 126 increases the length of the cavity from about 19 millimeters for 1250 nm or about 25 millimeters for 1350 nanometers.

Figure 8:
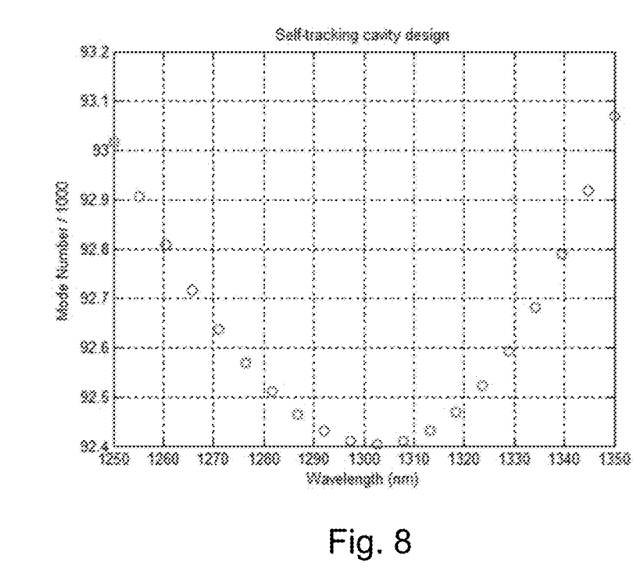
FIG. 8 is a plot of mode number as a function of wavelength in nanometers illustrating the operation of the cavity length compensator.

FIG. 8 is a plot of the mode number as a function of wavelength for the same scan band.

Figure 9A:
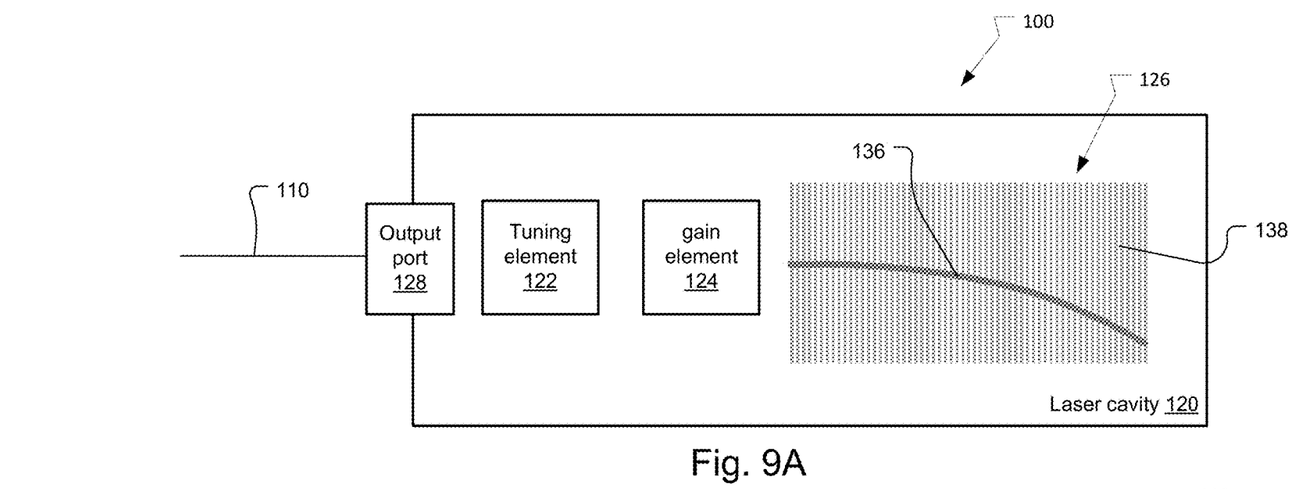
FIG. 9A is a schematic diagram illustrating a swept laser according to a third embodiment.

FIG. 9A illustrates another embodiment of the swept laser 100. This uses a Bragg grating cavity length compensating element 126. In more detail, the light exiting from the gain element 124 is coupled into a waveguide 136. The waveguide is fabricated in a substrate 138 that has a grating pattern, in one example. As a result, by curving the waveguide 136, the effective grating pitch is chirped and specifically lengthens over the length of the waveguide 136. This has the effect of increasing the optical length of the cavity 120 for longer wavelengths that are oscillating within the cavity.

Figure 9B:
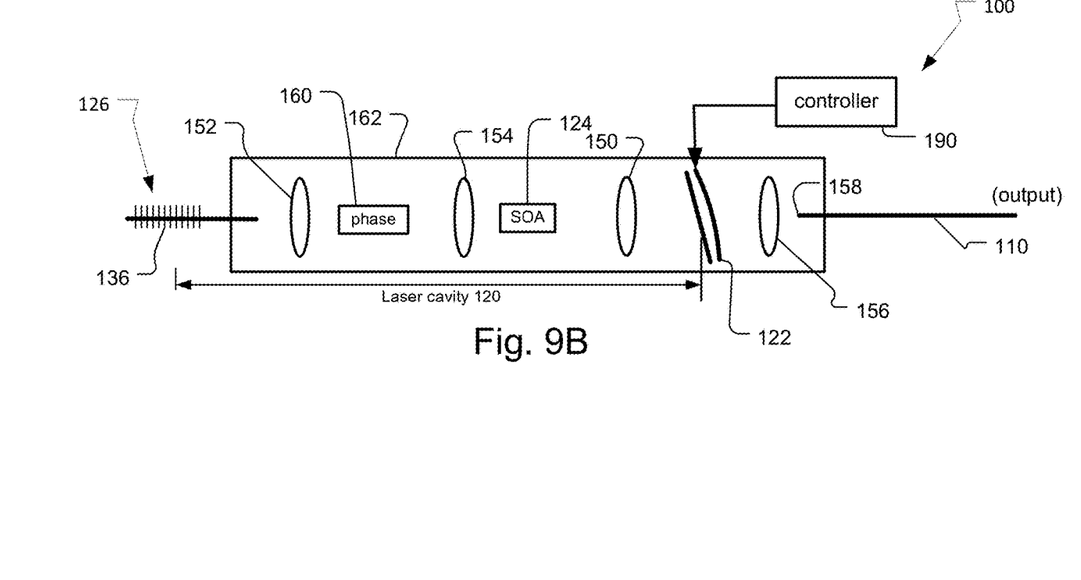
FIG. 9B is a schematic diagram illustrating a swept laser according to a first variant of the third embodiment.

FIG. 9B shows a variant in which the grating pattern is written directly into a fiber waveguide 136, for example. This fiber waveguide 136 is used at one end of the laser cavity 120, which also includes a phase modulator 160 and a gain element 124. The tuning element tunable filter 122 is located at the other end of cavity 120. Lens 150, 152, 154 are used to couple light between the elements. Lens 156 is used to couple light transmitted through the filter 122 into fiber 110. Preferably all of the elements are coupled to a common optical bench 162.

In one implementation, the fiber waveguide is directly coupled to the gain element using planar lightwave circuit technology. In one case, InP gain chip element 124 is coupled to a PLC (Planar Lightwave Circuit). The Bragg grating is written into the PLC such as by direct etching or UV writing in Ge-doped silica waveguides.

Figure 9C:
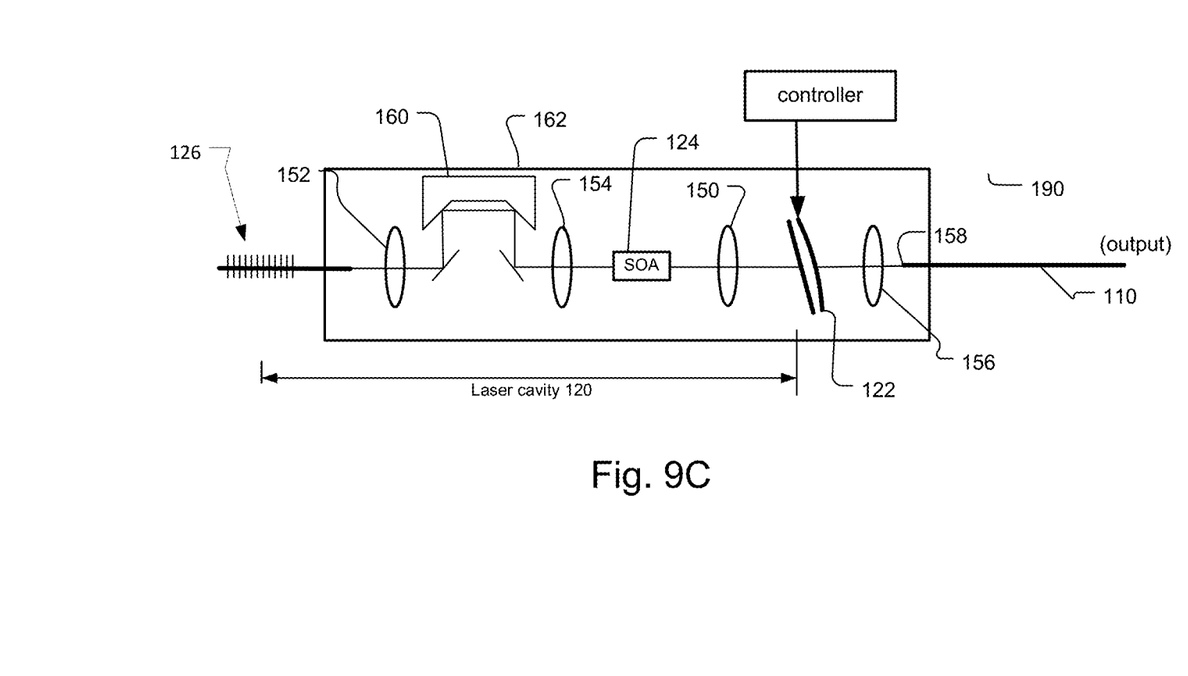
FIG. 9C is a schematic diagram illustrating a swept laser according to a second variant of the third embodiment.

FIG. 9C shows another variant that used a piezo reflective element 160 to actively modulate the length of the optical cavity 120.

Figure 10A:
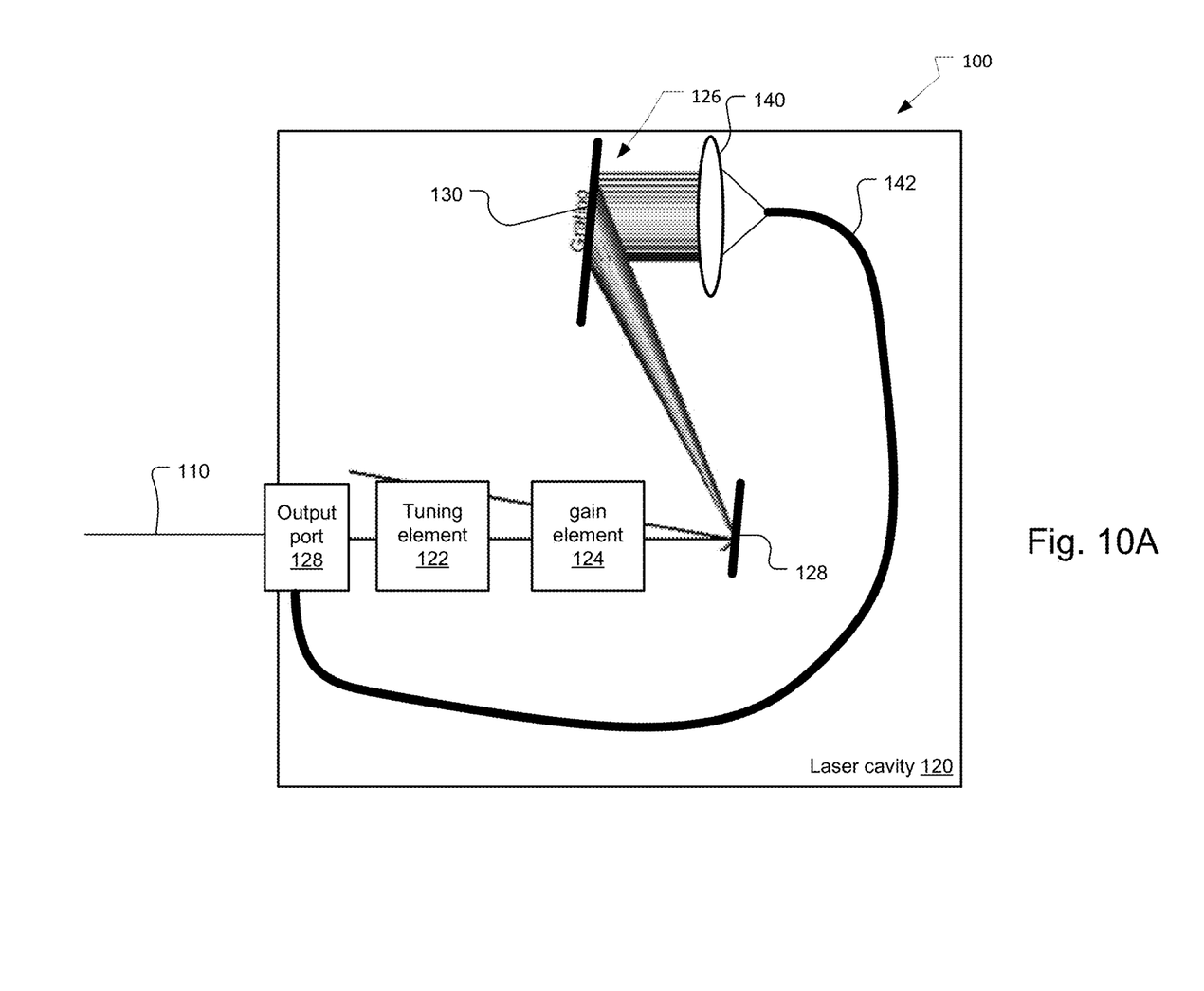
FIG. 10A is a schematic diagram illustrating a swept laser according to a fourth embodiment.

FIG. 10A illustrates still another embodiment. In the previous embodiment, the cavities 120 of the swept lasers have been linear cavities. The invention is relevant to other cavity configurations such as ring laser cavities, however, as illustrated by this embodiment.

In more detail, the light exiting from the gain element is reflected by the first grating 128 and then by the second grating 130. The light reflected by the second grating 130 is then collected by a lens or focusing element 140 to be coupled into an optical fiber 142, in one example. Other examples use free space optical paths.

Figure 10B:
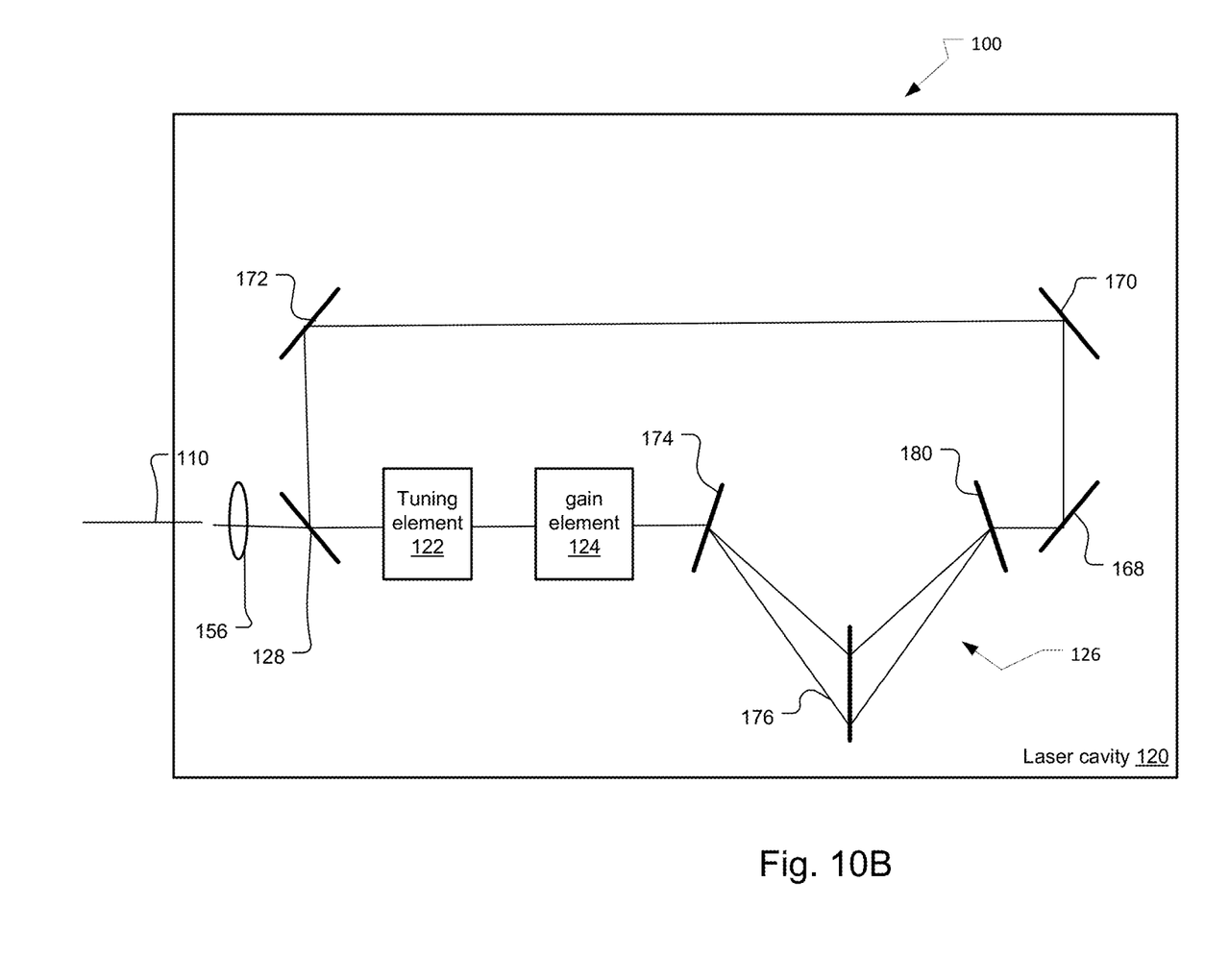
FIG. 10B is a schematic diagram illustrating a swept laser according to a first variant of the fourth embodiment.

FIG. 10B illustrates a variant that uses three gratings 174, 176, 180 in the ring cavity to function as the compensator 126 and control the length for different frequencies of light. It also has a free space ring that is defined by fold mirrors 168, 170, 172. Fold mirror 128 is partially reflective to also serve as the output port. Lens 156 couples the light from the laser onto fiber 110.

The optical fiber 142 completes the ring cavity by returning the light back to the output port 128 that couples a portion of the light into the cavity 120 and into the optical fiber 110.

Figure 10C:
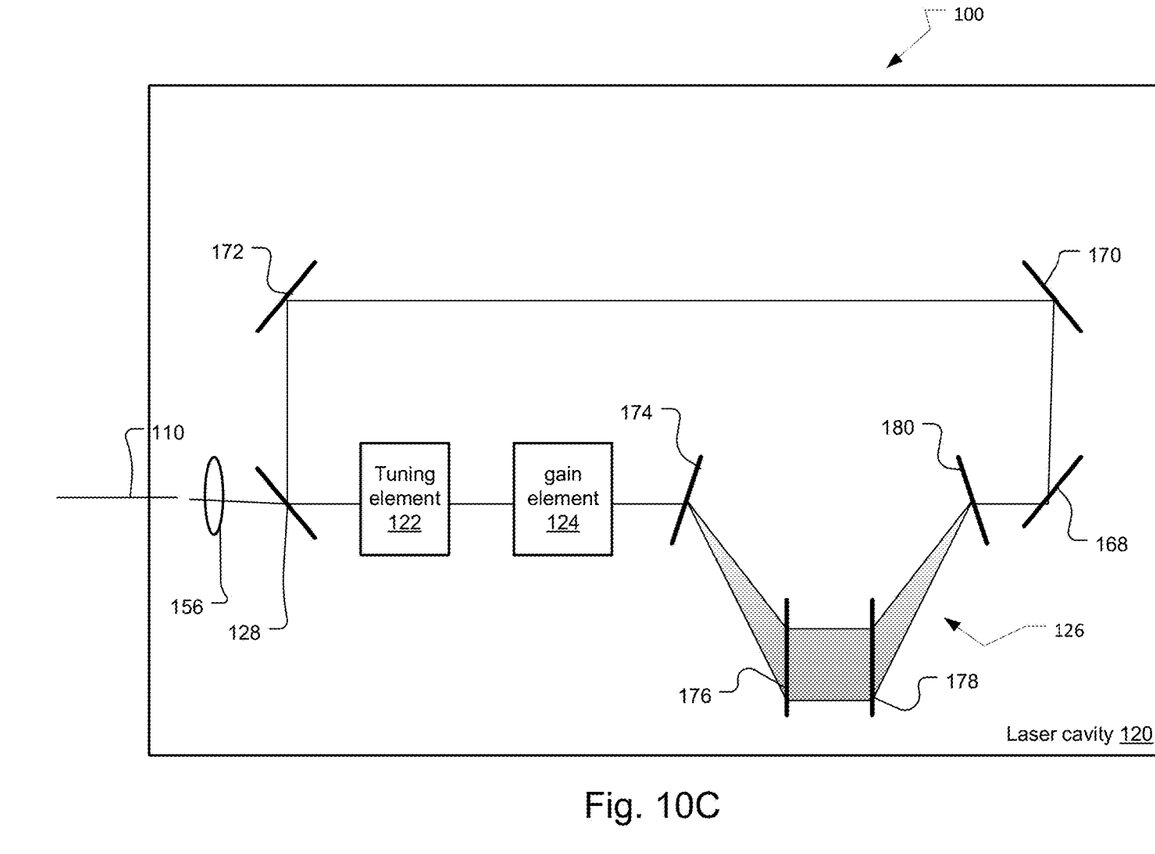
FIG. 10C is a schematic diagram illustrating a swept laser according to a second variant of the fourth embodiment.

FIG. 10C illustrates a variant that uses four gratings 174, 176, 178, 180 in the ring cavity to function as the compensator 126.

Figure 11:
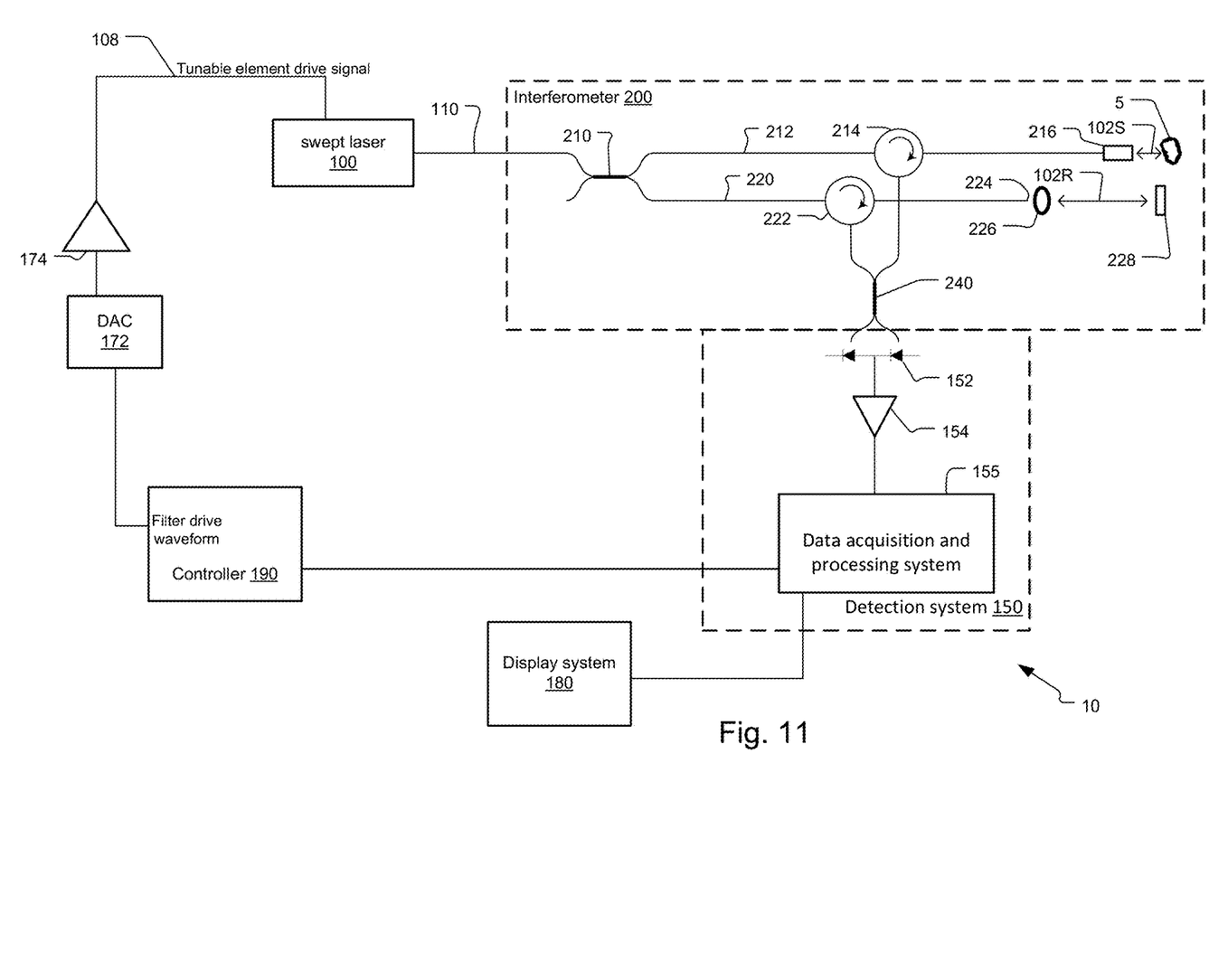
FIG. 11 is a schematic diagram of an optical coherence tomography system using the inventive swept laser.

FIG. 11 shows an optical coherence analysis system 10 using the swept laser 100, which has been constructed according to the principles of the present invention.

The swept laser 100 generates the tunable or swept optical signal on optical fiber 110 that is transmitted to interferometer 200. The swept optical signal scans over a scan band with a narrowband emission.

A controller 190 generates a drive waveform that is supplied to a digital to analog converter 105. This generates a tunable optical element drive signal 107 that is amplified by amplifier 103 and applied to the tuning element of 122 of the swept laser 100.

In the current embodiment, a Mach-Zehnder-type interferometer 200 is used to analyze the optical signals from the sample 5. The swept optical signal from the swept optical source system 100 is transmitted on fiber 110 to a 90/10 optical fiber coupler 210. The swept optical signal is divided by the coupler 210 between a reference arm 220 and a sample arm 212 of the system.

The optical fiber of the reference arm 220 terminates at the fiber endface 224. The light 102R exiting from the reference arm fiber endface 224 is collimated by a lens 226 and then reflected by a mirror 228 to return back, in some exemplary implementations.

The external mirror 228 has an adjustable fiber to mirror distance, in one example. This distance determines the depth range being imaged, i.e. the position in the sample 5 of the zero path length difference between the reference arm 220 and the sample arm 212. The distance is adjusted for different sampling probes and/or imaged samples. Light returning from the reference mirror 228 is returned to a reference arm circulator 222 and directed to a 50/50 fiber coupler 240.

The fiber on the sample arm 212 terminates at the sample arm probe 216. The exiting swept optical signal 102S is focused by the probe 216 onto the sample 5. Light returning from the sample 5 is returned to a sample arm circulator 214 and directed to the 50/50 fiber coupler 240.

The reference arm signal and the sample arm signal are combined in the fiber coupler 240 to generate an interference signal.

The interference signal is detected a detection system 150. Specifically, a balanced receiver, comprising two detectors 152, is located at each of the outputs of the fiber coupler 240. The electronic interference signal from the balanced receiver 152 is amplified by amplifier 154.

A data acquisition system 155 of the detection system 150 is used to sample the interference signal output from the amplifier 154.

Once a complete data set has been collected of the sample 5 by spatially raster scanning the focused probe beam point over the sample, in a Cartesian geometry, x-y, fashion or a cylindrical geometry theta-z fashion, and the spectral response at each one of these points is generated from the frequency tuning of the optical swept source system 100, the rendering system 195 performs a Fourier transform on the data in order to reconstruct the image and perform a 2D or 3D tomographic reconstruction of the sample 5. This information generated by the rendering system 195 can then be displayed on a video monitor.

In one application, the probe 216 is inserted into blood vessels and used to scan the inner wall of arteries and veins. In other examples, other analysis modalities are included in the probe such as intravascular ultrasound (IVUS), forward looking IVUS (FLIVUS), high-intensity focused ultrasound (HIFU), pressure sensing wires and image guided therapeutic devices. In still other applications, the probe is used to scan different portions of an eye or tooth or other structure of a patient or animal.

While this invention has been particularly shown and described with references to preferred embodiments thereof, it will be understood by those skilled in the art that various changes in form and details may be made therein without departing from the scope of the invention encompassed by the appended claims.

What is claimed is:

1. A swept laser that generates a swept optical signal, the swept laser comprising:
   a laser cavity in which the swept optical signal is generated;
   a tuning element for controlling an optical frequency of the swept optical signal;
   a gain element for amplifying light in the laser cavity; and
   a cavity length compensator that changes an optical length of the laser cavity for different optical frequencies that oscillate in the cavity during generation of the swept optical signal and tuning of the swept optical signal through a scanband; and
   wherein the cavity length compensator changes the optical length of the laser cavity for different optical frequencies to reduce mode hopping noise during frequency sweeping of the swept optical signal; and
   wherein the cavity length compensator comprises a first grating that disperses the light spatially, a second grating that reflects light at an angle to the first grating and then to a mirror, with the mirror reflecting light to return to the second grating.

2. A swept laser as claimed in claim 1, wherein the cavity length compensator changes the optical length of the laser cavity for different optical frequencies to increase the length of the laser cavity for lower optical frequencies.

3. A swept laser as claimed in claim 1, wherein the cavity length compensator changes the optical length of the laser cavity for different optical frequencies to shorten a spectral separation between longitudinal cavity modes of the laser cavity as a passband of a tuning element sweeps through the scanband of the swept optical signal.

4. A swept laser as claimed in claim 1, wherein the cavity length compensator comprises a grating for directing lower optical frequencies to travel over increasingly longer paths within the cavity.

5. A swept laser as claimed in claim 1, wherein the cavity length compensator comprises a fiber grating with a varying pitch along its length that reflects lower optical frequencies at increasingly longer paths within the cavity.

6. A swept laser as claimed in claim 1, wherein the cavity length compensator comprises a grating for directing higher optical frequencies over increasingly longer paths within the cavity.

7. A swept laser as claimed in claim 1, wherein the cavity length compensator comprises a fiber grating with a varying pitch along its length that reflects higher optical frequencies to travel over increasingly longer paths within the cavity.

8. A swept laser as claimed in claim 1, wherein the cavity is a linear cavity defined by reflectors at either end of the cavity.

9. A swept laser as claimed in claim 1, wherein the cavity is a ring cavity.

10. A swept laser as claimed in claim 1, wherein the gain element is semiconductor optical amplifier.

11. A swept laser as claimed in claim 1, further comprising a phase modulator in the laser cavity for modulating a phase of the light in the laser cavity.

12. A swept laser as claimed in claim 1, further comprising a controller for driving the tunable element to sweep through the scanband at greater than 50 kHz.

13. A swept laser as claimed in claim 1, wherein the cavity is a ring cavity.

14. A swept laser that generates a swept optical signal, the swept laser comprising:
   a laser cavity in which the swept optical signal is generated;
   a tuning element for controlling an optical frequency of the swept optical signal;
   a gain element for amplifying light in the laser cavity; and
   a cavity length compensator that changes an optical length of the laser cavity for different optical frequencies that oscillate in the cavity during generation of the swept optical signal and tuning of the swept optical signal through a scanband; and
   wherein the cavity length compensator changes the optical length of the laser cavity for different optical frequencies to reduce mode hopping noise during frequency sweeping of the swept optical signal; and
   wherein the cavity length compensator comprises a first grating that disperses the light spatially and a second grating that reflects light at an angle to the first grating and then to a lens.

15. A swept laser that generates a swept optical signal, the swept laser comprising:
   a laser cavity in which the swept optical signal is generated;
   a tuning element for controlling an optical frequency of the swept optical signal;
   a gain element for amplifying light in the laser cavity; and
   a cavity length compensator that changes an optical length of the laser cavity for different optical frequencies that oscillate in the cavity during generation of the swept optical signal and tuning of the swept optical signal through a scanband; and
   wherein the cavity length compensator changes the optical length of the laser cavity for different optical frequencies to reduce mode hopping noise during frequency sweeping of the swept optical signal; and
   wherein the cavity length compensator comprises a series of three gratings with a first grating that disperses the light spatially.

* * * * *